(12) United States Patent
Shimonishi et al.

(10) Patent No.: US 8,633,499 B2
(45) Date of Patent: Jan. 21, 2014

(54) LIGHT EMITTING DEVICE

(75) Inventors: Syota Shimonishi, Kiyosu (JP);
Hiroyuki Tajima, Kiyosu (JP); Yosuke Tsuchiya, Kiyosu (JP); Akira Sengoku, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/533,875

(22) Filed: Jun. 26, 2012

(65) Prior Publication Data

US 2013/0001604 A1 Jan. 3, 2013

(30) Foreign Application Priority Data

Jun. 28, 2011 (JP) ................................. 2011-143606

(51) Int. Cl.
*H01L 29/18* (2006.01)

(52) U.S. Cl.
USPC .............................................. 257/88; 438/28

(58) Field of Classification Search
USPC .................... 257/73–109, E33.067, E51.022, 257/E25.032, 50; 372/50, 80, 81, 82
See application file for complete search history.

(56) References Cited

U.S. PATENT DOCUMENTS

| 6,445,011 | B1 | 9/2002 | Hirano et al. |
| 7,843,131 | B2 | 11/2010 | Konishi et al. |
| 2002/0145205 | A1* | 10/2002 | Hirano et al. ................ 257/778 |
| 2010/0320483 | A1* | 12/2010 | Kadotani et al. .............. 257/88 |
| 2011/0049546 | A1* | 3/2011 | Heikman et al. .............. 257/98 |

FOREIGN PATENT DOCUMENTS

| JP | 2008-227412 A | 9/2008 |
| JP | 4296644 B2 | 7/2009 |

* cited by examiner

*Primary Examiner* — Steven Loke
*Assistant Examiner* — Mouloucoulaye Inoussa
(74) *Attorney, Agent, or Firm* — McGinn IP Law Group, PLLC (57) ABSTRACT

There is a reflective layer covering almost the entire surface of the light emitting portion except the portions where the light emitting elements are arranged, it is possible to increase the reflectivity of the light emitting portion to realize a higher luminance. In addition, the heat generated from the light emitting elements can be dissipated through the reflective layer, so that it is possible to prevent overheat of the light emitting device, and it is thus possible to improve the reliability of the light emitting device.

19 Claims, 7 Drawing Sheets

LIGHT EMITTING DEVICE

BACKGROUND OF THE INVENTION

1. Field of the Invention

The present invention relates to a light emitting device.

2. Description of the Related Art

Patent Reference 1 discloses a light emitting device, wherein a square-shaped flip chip of light emitting diodes and a square-shaped sub-mount are superposed with each other with their centers aligned with each other, and, at the same time, the flip chip is set rotated by 45° with respect to the sub-mount, and two lead-out electrodes are formed with respect to the flip chip on the upper surface exposed regions of the sub-mount.

Patent Reference 2 discloses a light emitting device, wherein a plurality of linear shaped wiring patterns are arranged parallel with each other on an insulating substrate, and it has a light emitting portion, wherein a plurality of light emitting elements are carried between the wiring patterns while they are electrically connected to the wiring patterns; and the light emitting portion is sealed by a sealing member.

Patent Reference 1: Japanese Patent No. 4296644
Patent Reference 2: JP-A-2008-227412

According to the invention described in Patent Reference 1, the area of the lead-out electrodes (external electrodes) is large on the square-shaped sub-mount (substrate), and the area of the flip chip is large, so that the light emitting region can also be made larger, making it possible to obtain a light emitting diode with a small size and a high luminance.

However, Patent Reference 1 discloses only the constitution using one flip chip.

Patent Reference 1 does not disclose or indicate the constitution that a plurality of flip chips is arranged in an overall square-shaped configuration and carried on a sub-mount.

Consequently, it is hard for the person skilled in the art to reach the idea of the constitution that a plurality of flip chips is arranged on the basis of Patent Reference 1.

According to the invention described in Patent Reference 2, the constitution has a nearly rectangular-shaped light emitting portion set rotated by 45° with respect to an insulating substrate (see FIG. 1).

However, Patent Reference 2 neither discloses nor indicates the constitution that the light emitting element is connected to the wiring pattern using wire bonding.

Also, Patent Reference 2 neither discloses nor indicates the constitution that the light emitting element is flip-chip bonded to the wiring pattern.

Consequently, it is hard for the person skilled in the art to reach the idea of the constitution using flip chip bonding on the basis of Patent Reference 2.

It is necessary to reduce the area of the substrate in order to miniaturize the size of the light emitting device.

Also, it is necessary to increase the size of the sealing region where a plurality of light emitting elements is sealed by a sealing member in order to increase the light emitting region.

Consequently, the outer peripheral edge of the sealing region and the external electrodes are arranged near each other. As a result, when solder is applied on the external electrodes, the solder and the solder flux corrode the sealing region and contaminate the sealing region. As the sealing region is contaminated, the luminance falls, and uneven light emission takes place, degrading the light emitting quality, which is undesirable.

In addition, in the manufacturing method wherein a sealing frame is formed on the outer peripheral edge of the sealing region and a sealing material is injected into the interior of the sealing frame, the sealing frame is prone to deformation so that it may easily shift outward. As a result, the sealing frame cannot work normally, and sealing may be impossible to perform, or the sealing region may deform, leading to degradation in the light emission quality, which is undesirable.

SUMMARY OF THE INVENTION

The purpose of the present invention is to solve the problems of the prior art by providing a small size light emitting device with a high luminance and a high light emitting quality.

The present inventors have carried out extensive studies in order to solve the problem. As a result of the studies, the following schemes of the present invention were reached.

<First Scheme>

The first scheme relates to a light emitting device having
a substrate,
a wiring pattern made of a wiring layer formed on the substrate,
a plurality of light emitting elements connected with the wiring pattern,
a sealing frame formed on the substrate to surround the plurality of light emitting elements,
a transparent sealing member filled in the interior of the sealing frame to seal the light emitting elements,
a light emitting portion formed in the sealing region as the sealing member is filled in the interior of the sealing frame,
external electrodes made of the wiring layer formed on the outer side of the sealing frame on the substrate,
a wall portion formed on the substrate and between the sealing frame and the external electrodes,
a slit formed between the wall portion and the sealing frame, and
a reflective layer, which is formed via an insulating layer on the wiring layer at the light emitting portion, and which covers almost the entire surface of the light emitting portion except the portions where the light emitting elements are arranged.

According to the first scheme, there is a wall portion formed on the substrate and between the sealing frame and the external electrodes. Consequently, when solder is applied on the external electrodes, the solder or the solder flux does not ride over the wall portion, so that the solder or the solder flux does not corrode the light emitting portion (sealing region) or soil it. As a result, it is possible to prevent decrease in the luminance, generation of uneven light emission, and degradation in the light emission quality caused by contamination of the light emitting portion in the prior art.

In addition, as there is a slit formed between the wall portion and the sealing frame, when the sealing material is injected to fill the interior of the sealing frame, the slit can suppress deformation in the sealing frame and outward sagging of the sealing material. As a result, it is possible to prevent the problem of failure of function of the sealing frame and thus failure of normal sealing, or deformation in the sealing region and thus degradation in the light emission quality.

Moreover, as there is a reflective layer covering almost the entire surface of the light emitting portion except the portions where the light emitting elements are arranged, it is possible to increase the reflectivity of the light emitting portion to realize a higher luminance. In addition, the heat generated from the light emitting elements can be dissipated through the reflective layer, so that it is possible to prevent overheat of the light emitting device, and it is thus possible to improve the reliability of the light emitting device.

As a result, according to the first scheme, the present invention can provide a small size light emitting device with high luminance and high light emission quality.

<Second Scheme>

The second scheme relates to the light emitting device according to the first scheme, wherein the wall portion is made of the reflective layer.

Consequently, according to the second scheme, the wall portion and the reflective layer can be shared, so that it is possible to cut the manufacturing cost of the light emitting device as compared with the case when the wall portion alone is formed as a separate member.

<Third Scheme>

The third scheme relates to the light emitting device according to the first or the second scheme, wherein the light emitting elements are connected with the wiring pattern by flip chip bonding.

When the light emitting elements are connected by wire bonding, because the bonding wires and bonding pads are arranged in the light emitting portion, the area of the portion where the reflective layer is covered by the light emitting portion becomes smaller correspondingly.

On the other hand, according to the second scheme, different from the case when the light emitting elements are connected with the wiring pattern by wire bonding, the area of the portion covered by the light emitting portion can be increased, so that the reflectivity of the light emitting portion can be increased.

<Fourth Scheme>

The fourth scheme relates to the light emitting device according to the first through third schemes, wherein at the light emitting portion, a gap corresponding to the wiring pattern is formed between the reflective layer and the insulating layer.

When no gap corresponding to the wiring pattern is formed between the reflective layer and the insulating layer in the light emitting portion, if the reflective layer is made of an electro-conductive material, the current that should flow in the light emitting elements through the wiring pattern may leak through the reflective layer, decreasing the voltage rating of the wiring pattern decreases, which is undesirable.

On the other hand, according to the fourth scheme, it is possible to prevent the current that should flow through the wiring pattern to the light emitting elements from leaking via the reflective layer, so that it is possible to increase the voltage rating of the wiring pattern, and it is thus possible to improve the reliability of the light emitting device.

<Fifth Scheme>

The fifth scheme relates to the light emitting device according to the first through fourth schemes, wherein a triangular-shaped gap with a wider dimension on the outer edge side of the substrate (the outer side of the sealing frame) is formed between the external electrodes for the wiring pattern.

When no gap is formed between the external electrodes at the wiring pattern, and when solder is applied on the external electrodes, solder bridges may take place between the external electrodes, so that short circuit may take place.

On the other hand, according to the fifth scheme, it is possible to prevent solder bridges and thus short circuit from taking place between the external electrodes. As a result, it is possible to improve the reliability of the light emitting device.

<Sixth Scheme>

The sixth scheme relates to the light emitting device according to the first through fifth schemes, wherein the reflective layer is made of silver, and there is a protective film formed on the reflective layer to protect the reflective layer.

Consequently, according to the sixth scheme, as silver with high reflectivity is adopted in forming the reflective layer, it is possible to increase the reflectivity of the reflective layer, and it is possible to prevent degradation of silver by the protective film.

<Seventh Scheme>

The seventh scheme relates to the light emitting device according to the first through sixth schemes, wherein the substrate has a rectangular shape, the sealing frame has a nearly rectangular frame shape, and, on the substrate, the sealing frame is arranged with its outer peripheral edge inclined with respect to the outer peripheral edge of the substrate.

Consequently, according to the seventh scheme, it is possible to increase the area of the external electrodes, while increasing the area of the light emitting portion and increasing the region of the light emitting portion (light emitting region), and it is thus possible to obtain a small size light emitting device with a high luminance.

<Eighth Scheme>

The eighth scheme relates to the light emitting device according to anyone of the first through sixth schemes, wherein the substrate has a rectangular shape, and the sealing frame has a round frame shape.

Consequently, according to the eighth scheme, it is possible to guarantee the area of the external electrodes, and, at the some time, it is possible to have a round shape for the light emitting portion, making it possible to provide favorable appearance.

BRIEF DESCRIPTION OF THE DRAWINGS

FIG. 1.

FIG. 2.

FIG. 5.

FIG. 6.

DESCRIPTION OF THE PREFERRED EMBODIMENTS

The embodiments of the present invention will be explained in the following with reference to the drawings.

The same keys are adopted throughout the embodiments to represent the same structural members and composing requirements, so they will not be explained repeatedly.

Embodiment 1

As shown in FIGS. 1 through 4, in Embodiment 1, the light emitting device 10 comprises a substrate 11, an adhesive layer 12, a heat dissipation layer 13, an adhesive layer 14, a wiring layer 15 (wiring regions 15a through 15g), an insulating layer 16, a reflective layer 17, a protective film 18, a sealing frame 19, a slit 20, a wall portion 21, external electrodes 22a, 22b, solder 23. LED chips 24, bumps 25, electrode pads 26, a sealing member 27, a sealing region 28, a light emitting portion 29, a wiring pattern 30, as well as opening portion H of the insulating layer 16, reflective layer 17 and protective film 18, and gaps Sa, Sb of the wiring pattern 30.

Figure 3:
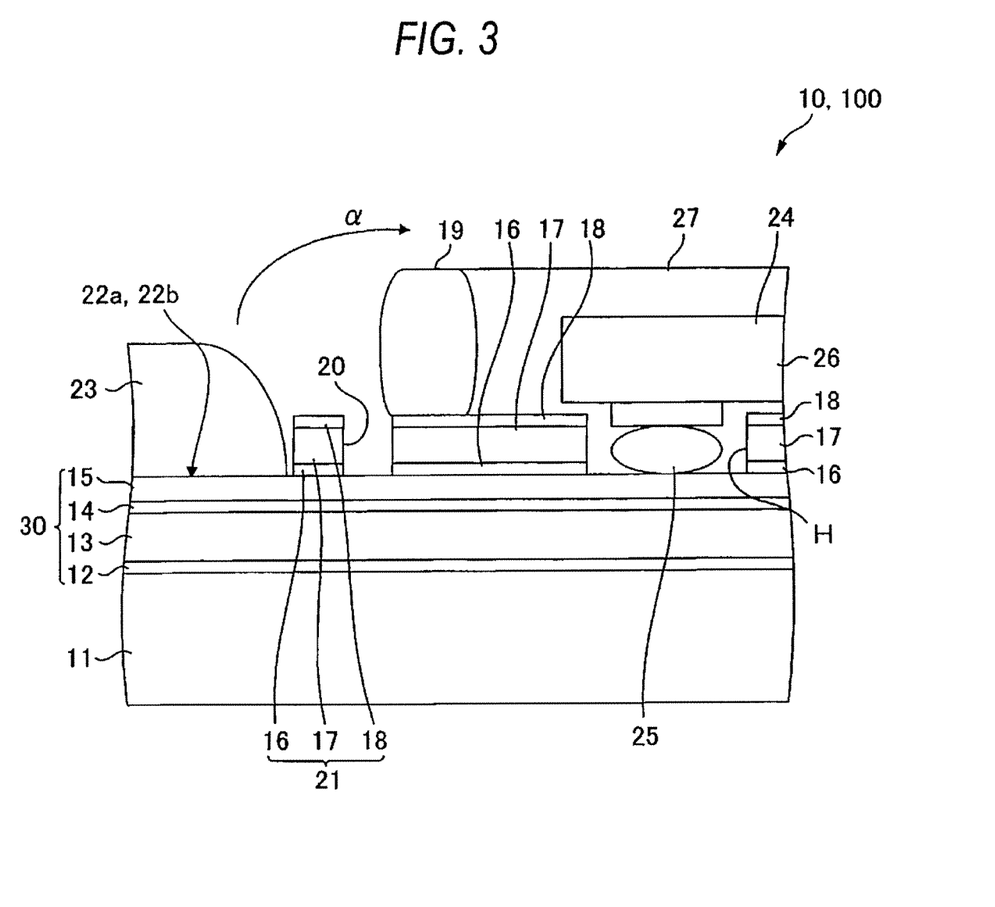
FIG. 3 is a schematic vertical cross-sectional view illustrating the light emitting device 10 in Embodiment 1, and the light emitting device 100 in Embodiment 2 of the present invention.

In FIG. 3, in order to facilitate explanation, the dimensions and shapes of the various members that form the light emitting device 10 are shown schematically in exaggerated way. That is, they are different from the actual dimensions and shapes of the various members.

As shown in FIG. 3, the adhesive layer 12, the heat dissipation layer 13 and the adhesive layer 14 are laminated in order on the entire outer surface of the substrate 11.

Then, the following layers are laminated in order on the adhesive layer 14: the wiring layer 15, the insulating layer 16, the reflective layer 17, and the protective film 18.

The sealing frame 19 is formed on the protective film 18, and, at the same time, it is also formed along the outer edge of the protective film 18.

The slit 20 is drilled on the laminated insulating layer 16, reflective layer 17 and protective film 18, until reaching the outer surface of the wiring layer 15 on the outer side of the sealing frame 19.

For the laminated insulating layer 16, reflective layer 17 and protective film 18, the portion formed on the outer side of the slit 20 becomes the wall portion 21.

On the wiring layer 15, the regions exposed from the outer surface of the substrate 11 on the outer side of the wall portion 21 become the external electrodes 22a, 22b.

The solder 23 is applied on the external electrodes 22a, 22b in a soldering operation, and the connecting terminals of the external equipment (not shown in the drawing) are connected with the external electrodes 22a, 22b via the solder 23.

The LED chips 24 are assembled and carried on the substrate 11 as they are connected by the flip chip bonding method using the bumps 25 to the wiring layer 15 via the opening portion H formed through the insulating layer 16, reflective layer 17 and protective film 18.

That is, on the lower surface side of the LED chips 24, electrode pads 26 are formed and connected with the semiconductor regions (not shown in the drawing) of the LED chips 24. Then, the electrode pads 26 and the wiring layer 15 are connected with each other via the bumps 25.

The LED chips 24 are arranged on the inner side of the sealing frame 19.

A transparent sealing member 27 is injected and filled in the interior of the sealing frame 19, so that the LED chips 24, bumps 25 and electrode pads 26 are buried in the sealing member 27 and sealed there.

Here, the substrate 11 is an insulating substrate made of aluminum nitride.

The adhesive layers 12, 14 are made of nickel, the heat dissipation layer 13 is made of copper, and the wiring layer 15 is made of gold.

The adhesive layer 12 is arranged for bonding the substrate 11 with the heat dissipation layer 13, and the adhesive layer 14 is arranged for bonding the heat dissipation layer 13 with the wiring layer 15.

The insulating layer 16 is made of a nickel-based oxide, the reflective layer 17 is made of silver, and the protective film 18 is made of silicon oxide.

The insulating layer 16 is arranged for insulating the wiring layer 15 and the reflective layer 17 from each other.

The protective film 18 is arranged for protecting the outer surface of the reflective layer 17.

The sealing frame 19 is made of a thermosetting synthetic resin (such as epoxy resin, silicone resin or the like), and the sealing member 27 is made of a transparent silicone resin containing phosphor.

Figure 1:
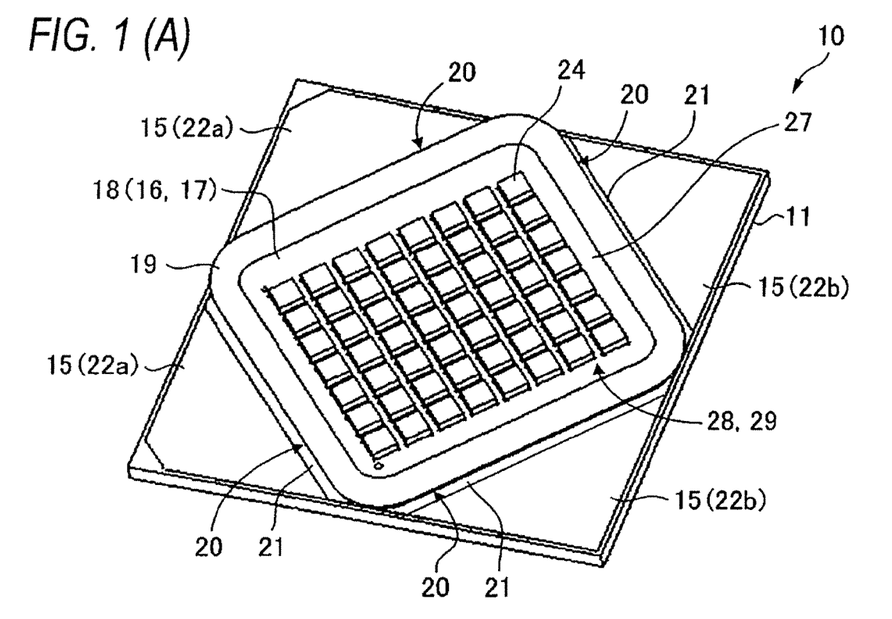
FIG. 1(A) is an oblique view illustrating the light emitting device 10 in Embodiment 1 of the present invention.
FIG. 1(B) is a plane view illustrating the light emitting device 10.
Figure 2:
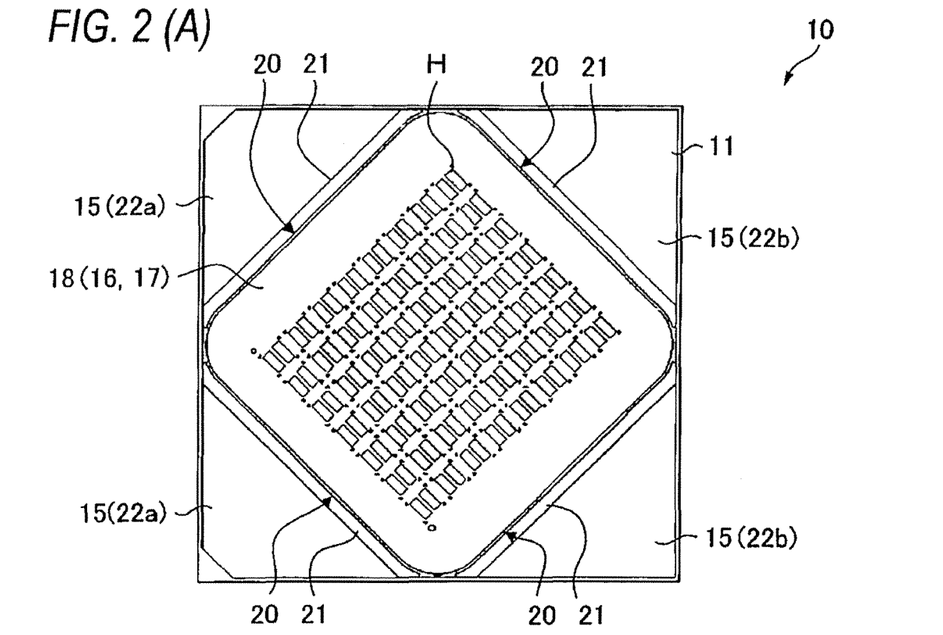
FIG. 2(A) is a plane view illustrating the wiring layer 15, insulating layer 16, reflective layer 17, and protective film 18 of the light emitting device 10.
FIG. 2(B) is a plane view illustrating the adhesive layer 12, heat dissipation layer 13, adhesive layer 14, and wiring layer 15 of the light emitting device 10.

As shown in FIG. 1, the sealing frame 19 is a nearly square-shaped frame (frame shape) with an R shape formed at the four corners. The interior portion surrounded by the sealing frame 19 becomes the sealing region 28 into which the sealing member 27 has been filled. The light emitting portion 29 is formed in the sealing region 28. In other words, the sealing frame 19 is arranged and formed on the outer peripheral edge of the sealing region 28 and the light emitting portion 29.

The substrate 11 has a square plate shape. The light emitting portion 29 is a nearly square-shaped flat member with an R shape formed at the four corners. The substrate 11 and the light emitting portion 29 are superposed with each other with a shared central axis O. At the same time, the light emitting portion 29 is set rotated by about 45° with respect to the substrate 11 around the central axis O, and the light emitting portion 29 is arranged on the substrate 11 in this configuration.

The wiring layer 15 formed on the outer side of the sealing frame 19 on the substrate 11 becomes the external electrodes 22a, 22b. That is, the external electrodes 22a, 22b are formed in the triangular shaped regions at the four corners on the substrate 11.

In FIG. 1, the solder 23 (see FIG. 3) applied by soldering on the external electrodes 22a, 22b is not shown in the drawing.

In the light emitting portion 29, the LED chips 24 refer to a group of LED chips comprising a total of 56 LED chips 24 arranged in a checkerboard configuration with 7×8 chips arranged side-by-side in the lateral and longitudinal directions, respectively, and having gaps in between. The edges of the LED chip group are parallel with the edges of the outer peripheral edge of the light emitting portion 29, respectively.

The slit 20 is arranged and formed on the outer side of the sealing frame 19 along the edges of the outer peripheral edge of the light emitting portion 29.

The corner portions of the light emitting portion 29 are arranged on the outer peripheral edge of the substrate 11, and the sealing frame 19 at the corner portions of the light emitting portion 29 are in contact with the outer peripheral edge of the substrate 11, so that the slit 20 is not formed on the outer side of the sealing frame 19 at the corner portions of the light emitting portion 29.

The linear-shaped wall portion 21 is arranged and formed on the outer side of the slit 20.

In other words, the wall portion 21 is formed between the sealing frame 19 and the external electrodes 22a, 22b on the substrate 11, and the slit 20 is formed between the wall portion 21 and the sealing frame 19.

As shown in FIG. 2(A), in the state when the sealing frame 19, solder 23, LED chips 24, bumps 25, electrode pads 26, and sealing member 27 are removed from the light emitting device 10, the slit 20, the wiring layer 15 exposed from the bottom surface of the slit 20, the wiring layer 15 that makes the external electrodes 22a, 22b, the wall portion 21, and the protective film 18 are formed on the outer surface of the substrate 11.

In FIG. 2(A), the wiring layer 15 (see FIG. 3), exposed from the bottom surface of the slit 20, is not shown in the drawing.

In this connection. FIG. 2(A) is a plane view illustrating the structure formed after the adhesive layer 12, heat dissipation layer 13, adhesive layer 14, wiring layer 15, insulating layer 16, reflective layer 17, protective film 18, slit 20, and wall portion 21 are sequentially formed on the substrate 11.

The insulating layer 16 is formed beneath the reflective layer 17, and the protective film 18 is formed on the reflective layer 17, so that the insulating layer 16, protective film 18 and reflective layer 17 have the same planar shape.

An opening portion H is formed for making flip chip bonding of the LED chips 24 (see FIG. 1 and FIG. 3) on the laminated insulating layer 16, reflective layer 17 and protective film 18.

The insulating layer 16, reflective layer 17 and protective film 18 are formed and laminated in the light emitting portion 29 to cover almost the entire surface of the light emitting portion 29 except the portions where LED chips 24 are formed.

As shown in FIG. 2(B), the wiring layer 15 is formed on the outer surface of the substrate 11 in the state in which the sealing frame 19, solder 23, LED chips 24, bumps 25, electrode pads 26, sealing member 27, insulating layer 16, reflective layer 17, and protective film 18 are removed from the light emitting device 10.

In this connection. FIG. 2(B) is a plane view illustrating the structure after the adhesive layer 12, heat dissipation layer 13, adhesive layer 14, and wiring layer 15 are formed sequentially on the substrate 11.

On the laminated adhesive layer 12, heat dissipation layer 13, adhesive layer 14 and wiring layer 15, the rectangular shaped wiring regions 15a through 15g for making series/parallel connection of the plurality of LED chips 24 (see FIG. 1 and FIG. 3) are formed side-by-side with gaps in between.

Then, the wiring pattern 30 is formed from the wiring regions 15a through 15g and the external electrodes 22a, 22b, and the LED chips 24 are connected to the wiring pattern 30. That is, the wiring pattern 30 is formed from the laminated adhesive layer 12, heat dissipation layer 13, adhesive layer 14 and wiring layer 15.

Also, nearly triangular-shaped gaps Sa, Sb are arranged and formed on the wiring pattern 30 to reach the outer surface of the substrate 11 between the external electrodes 22a, 22b, exposing the outer surface of the substrate 11 from the gaps Sa, Sb.

Figure 4:
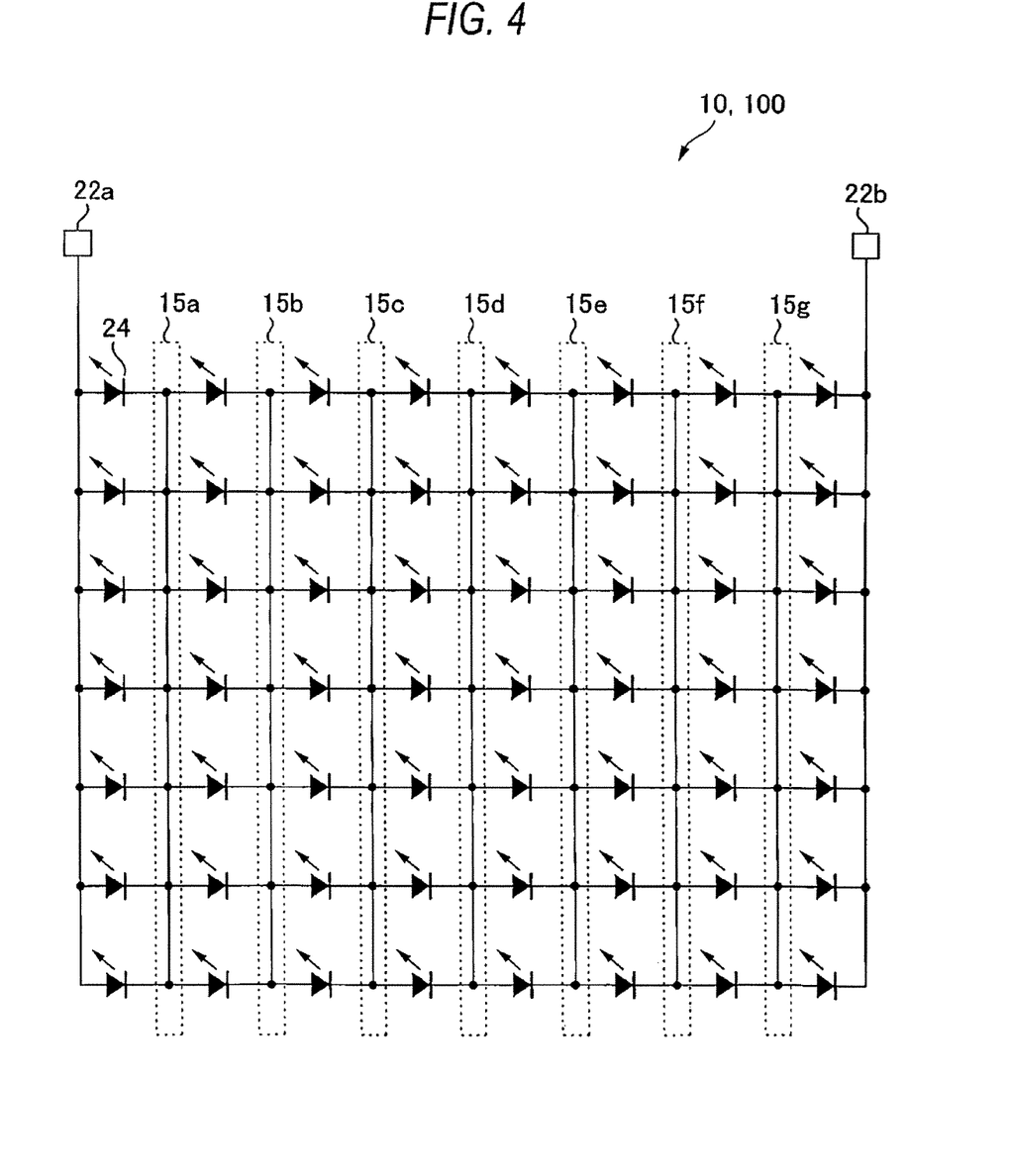
FIG. 4 is a circuit diagram illustrating the connection state of LED chips 24 that form the light emitting devices 10 and 100.

As shown in FIG. 4, 56 LED chips 24 are series/parallel connected in a ladder configuration between the external electrodes 22a, 22b and having the wiring regions 15a through 15g sandwiched between them. Here, the external electrode 22a forms the anode-side electrode of the series/parallel circuit of the LED chips 24, and the external electrode 22b forms the cathode-side electrode of the series/parallel circuit of the LED chips 24.

Operation and Advantages of Embodiment 1

The following operation and advantages can be realized for the light emitting device 10 in Embodiment 1.

[1] On the substrate 11, there is the wall portion 21 formed between the sealing frame 19 and the external electrodes 22a, 22b. Consequently, when the solder 23 is applied by soldering on the external electrodes 22a, 22b, as indicated by arrow a in FIG. 3, there is no way that solder 23 or solder flux (not shown in the drawing) can ride over the wall portion 21.

Consequently, it is possible to prevent corrosion of the light emitting portion 29 (sealing region 28) by the solder 23 or the solder flux. As a result, it is possible to prevent decrease in the luminance, generation of uneven light emission and degradation in the light emission quality caused by contamination of the light emitting portion 29.

[2] Because there is the slit 20 formed between the wall portion 21 and the sealing frame 19, when the sealing member 27 is injected to fill the interior of the sealing frame 19, the slit 20 can suppress the problem of deformation of the sealing frame 19 and sagging to the outer side (in the direction indicated by arrow β in FIG. 3). As a result, it is possible to prevent the problem of failure of function of the sealing frame 19 and thus failure of normal sealing, or deformation in the sealing region 28 and thus degradation in the light emission quality.

[3] Because there is the reflective layer 17 that covers almost the entire surface of the light emitting portion 29 except the portions where the LED chips 24 are arranged, it is possible to increase the reflectivity of the light emitting portion 29 and to realize higher luminance.

In addition, the heat generated by the LED chips 24 can be dissipated through the reflective layer 17, so that it is possible to prevent overheat of the light emitting device 10, and thus to improve the reliability.

[4] The wall portion 21 is formed from the laminated insulating layer 16, reflective layer 17 and protective film 18.

Consequently, the wall portion 21 can be shared with the laminated member (insulating layer 16, reflective layer 17 and protective film 18). Consequently, different from the case when the wall portion 21 alone is formed from another member, it is possible to cut the manufacturing cost of the light emitting device 10.

In addition, the protective film 18 is formed on the surface of the wall portion 21, and the protective film 18 is made of silicon oxide, an insulating inorganic material. Because the insulating inorganic material has a low wettability with respect to the solder, it is possible to reliably prevent the solder 23 or the solder flux from riding over the wall portion 21, so that the effects of the [1] can be further augmented.

[5] The LED chips 24 are connected with the wiring pattern 30 by the flip chip bonding.

When the LED chips 24 are connected with the wiring pattern 30 by the wire bonding, because the bonding wires and bonding pads are arranged in the light emitting portion 29, the area of the portion of the light emitting portion 29 covered by the reflective layer 17 becomes smaller correspondingly.

On the other hand, for the light emitting device 10, different from the case when the LED chips 24 are connected with the wiring pattern 30 by the wire bonding, the area of the portion of the light emitting portion 29 covered with the reflective layer 17 can be larger, so that it is possible to increase the reflectivity of the light emitting portion 29.

[6] Triangular-shaped gaps Sa. Sb with a wider outer edge side of the substrate 11 (outer side of the sealing frame 19) are formed between the external electrodes 22a, 22b on the wiring pattern 30.

When the gaps Sa. Sb are not formed between the external electrodes 22a, 22b on the wiring pattern 30, solder bridges may take place between the external electrodes 22a, 22b during soldering on the external electrodes 22a, 22b so that short circuit may take place.

On the other hand, for the light emitting device 10, it is possible to prevent short circuit caused by solder bridges between the external electrodes 22a, 22b, so that it is possible to improve the reliability of the light emitting device 10.

[7] The reflective layer 17 is made of silver, and it is equipped with a protective film 18 formed on the reflective layer 17 for protecting the reflective layer 17.

Consequently, for the light emitting device 10, as silver is used as the reflective layer 17, it is possible to increase the reflectivity of the reflective layer 17, and it is possible to prevent degradation of the silver by the protective film 18.

[8] The substrate 11 and the light emitting portion 29 are superposed with each other with a shared central axis O. At the same time, the light emitting portion 29 is set rotated by about 45° with respect to the substrate 11 around the central axis O, and the light emitting portion 29 is arranged on the substrate 11 in this configuration.

In other words, the outer peripheral edge of the sealing frame 19 on the substrate 11 is arranged to be inclined with respect to the outer peripheral edge of the substrate 11.

Consequently, while the area of the external electrodes 22a, 22b is increased, the area of the light emitting portion 29 can be increased and the region of the light emitting portion 29 (the light emitting region) also becomes larger, so that it is possible to obtain a small size light emitting device 10 with a high luminance.

[9] Because the sealing frame 19 is formed along the outer edge of the protective film 18, the shape of the sealing frame 19 can be well maintained without break-down.

Here, as the sealing frame 19 is formed on the protective film 18, the sealing frame 19 can reliably withstand the force acting outward on the inner side of the sealing frame 19 when the sealing member 27 is injected to the interior of the sealing frame 19 (sealing operation). As a result, it is possible to reliably prevent deformation of the sealing frame 19 outward (in the direction indicated by arrow β shown in FIG. 3), and sagging of the sealing material, so that the advantage of the [2] can be augmented.

Embodiment 2

As shown in FIGS. 3 to 6, the light emitting device 100 of Embodiment 2 comprises a substrate 11, an adhesive layer 12, a heat dissipation layer 13, an adhesive layer 14, a wiring layer 15 (wiring regions 15a through 15g), an insulating layer 16, a reflective layer 17, a protective film 18, a sealing frame 19, a slit 20, a wall portion 21, external electrodes 22a, 22b, solder 23, LED chips 24, bumps 25, electrode pads 26, a sealing member 27, a sealing region 28, a light emitting portion 29, a wiring pattern 30, as well as opening portion H of the insulating layer 16, reflective layer 17 and protective film 18, gaps Sa, Sb of the wiring pattern 30, and a gap (slit) 101 of the insulating layer 16, reflective layer 17 and protective film 18.

Embodiment 2 differs from Embodiment 1 in the following features.

Figure 5:
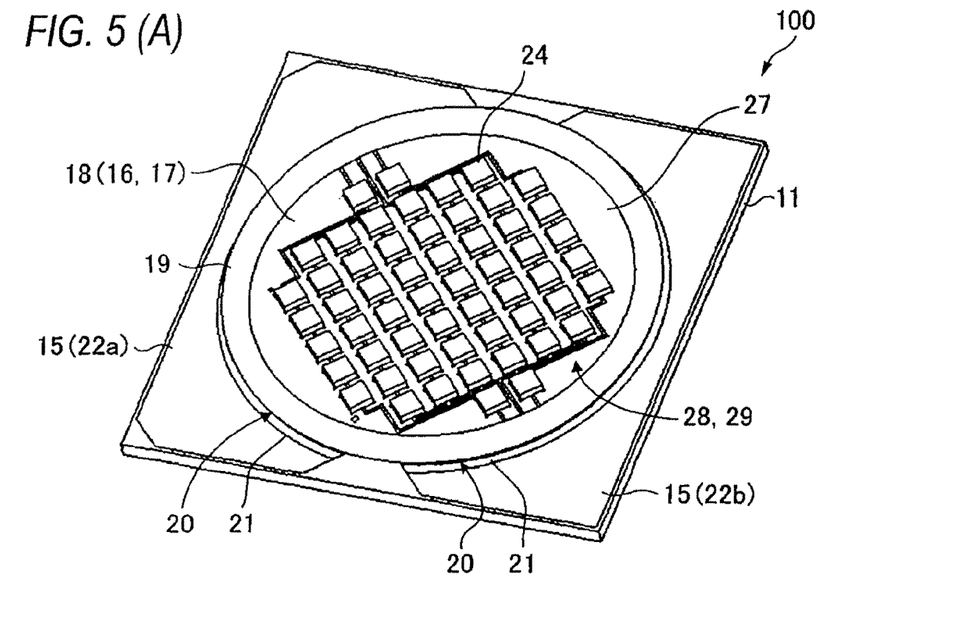
FIG. 5(A) is an oblique view of the light emitting device 100 in Embodiment 2.
FIG. 5(B) is a plane view of the light emitting device 100.

[a] As shown in FIG. 5, the light emitting portion 29 has a flat round shape, and the substrate 11 and the light emitting portion 29 are superposed with each other with shared central axis O.

In addition, in FIG. 5, the solder 23 (see FIG. 3) applied by soldering on the external electrodes 22a, 22b is not shown in the drawing.

[b] As shown in FIG. 5, in the light emitting portion 29, instead of the 7×8 checkerboard configuration set side-by-side with gaps in the longitudinal and lateral directions, the four LED chips 24 at the four corner portions are removed, and the removed LED chips 24 are then re-arranged at two sites each having two of them set side-by-side in the central portion in the lateral direction on the two sides in the longitudinal direction of the LED chip group, respectively, and the LED chip group is arranged at the center of the light emitting portion 29.

[c] As shown in FIG. 5, the sealing frame 19 arranged and formed on the outer peripheral edge of the light emitting portion 29 has a round frame shape (donut shape). As shown in FIGS. 5 and 6(A), the slit 20 arranged and formed on the outer side along the outer peripheral edge of the light emitting portion 29 is also in a round frame shape. The wall portion 21 arranged and formed on the outer side along the outer peripheral edge of the slit 20 is also in a round frame shape.

Consequently, it is possible to guarantee the area of the external electrodes 22a, 22b, and, at the same time, it is possible to improve the appearance as the light emitting portion 29 has a round shape.

Figure 6:
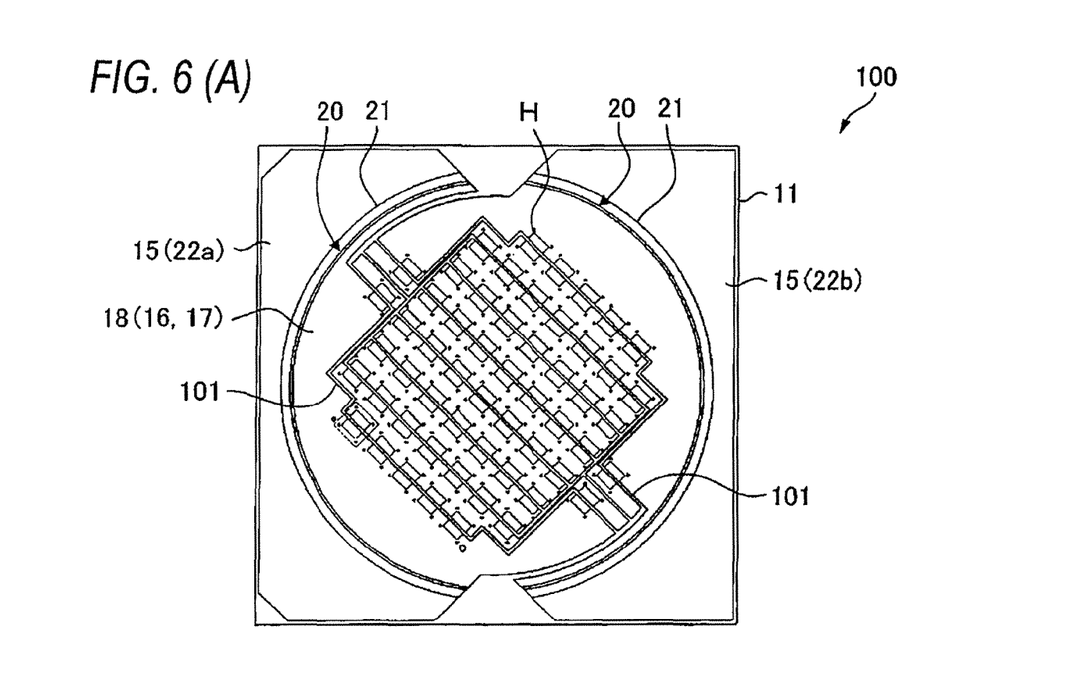
FIG. 6(A) is a plane view illustrating the wiring layer 15, insulating layer 16, reflective layer 17, and protective film 18 of the light emitting device 100.
FIG. 6(B) is a plane view illustrating the adhesive layer 12, heat dissipation layer 13, adhesive layer 14, and wiring layer 15 of the light emitting device 100.

(d) As shown in FIG. 6, a gap 101 in agreement with the wiring pattern 30 is formed on the laminated insulating layer 16, reflective layer 17 and protective film 18 in the light emitting portion 29.

When the gap 101 is not formed, the current that should flow through the wiring pattern 30 in the LED chips 24 may leak through the reflective layer 17, degrading the voltage rating of the wiring pattern 30, which is undesirable.

On the other hand, according to Embodiment 2, it is possible to prevent the current that should flow via the wiring pattern 30 to the LED chips 24 from leaking via the reflective layer 17, and it is possible to increase the voltage rating of the wiring pattern 30, and it is possible to improve the reliability of the light emitting device 100.

Embodiment 3

Figure 7:
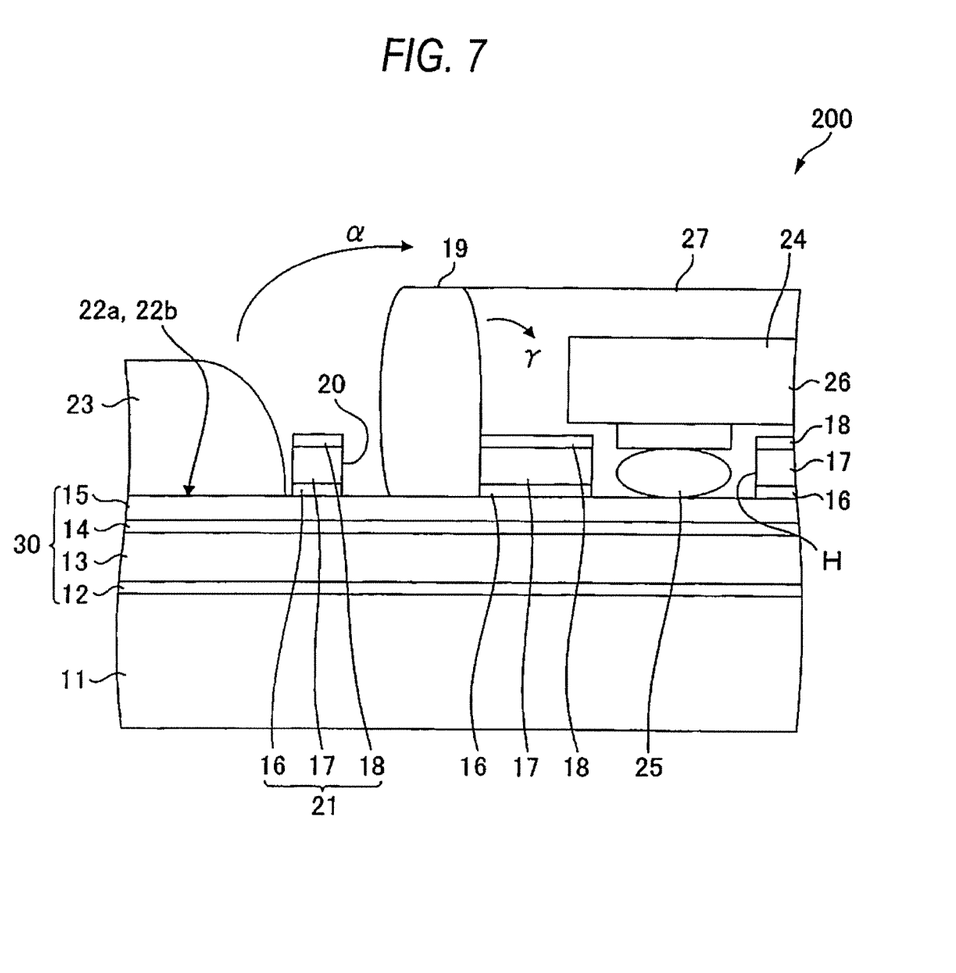
FIG. 7 is a schematic vertical cross-sectional view illustrating the light emitting device 200 in Embodiment 3 of the present invention.

As shown in FIG. 7, the light emitting device 200 of Embodiment 3 comprises a substrate 11, an adhesive layer 12, a heat dissipation layer 13, an adhesive layer 14, a wiring layer 15, an insulating layer 16, a reflective layer 17, a protective film 18, a sealing frame 19, a slit 20, a wall portion 21, external electrodes 22a, 22b, solder 23, LED chips 24, bumps 25, electrode pads 26, a sealing member 27, a sealing region 28, a light emitting portion 29, a wiring pattern 30, as well as opening portion H of the insulating layer 16, reflective layer 17 and protective film 18.

Embodiment 3 differs from Embodiment 1 in the following feature: the sealing frame 19 is formed on the wiring layer 15 in the outer side portion of the protective film 18, and, at the same time, it is formed in contact with the outer peripheral surface of the laminated film (insulating layer 16, reflective layer 17, protective film 18) along the outer edge of the protective film 18.

Consequently, according to Embodiment 3, too, the sealing frame 19 is formed along the outer edge of the protective film 18, so that the shape of the sealing frame 19 becomes difficult to break.

According to Embodiment 3, when the sealing frame 19 is deformed, and sagging takes place inward (in the direction indicated by arrow γ shown in FIG. 7), the sealing frame 19 is locked by the outer peripheral surface of the laminated films, so that it is possible to prevent sagging of sealing frame 19 inward.

Other Embodiments>

The present invention is not limited to the embodiments. The following embodiments may also be adopted to obtain the same operations and advantages as mentioned previously.

[A] In Embodiment 1, the angle between the substrate 11 and the light emitting portion 29 is not limited to about 45°, and other appropriate angle may be selected for rotating and arrangement.

In addition, the substrate 11 and the light emitting portion 29 may be superposed with each other without sharing the central axis O.

[B] The various members that form the light emitting device 10 are not limited to the materials in the examples. Any materials that can realize the same operation and advantages as mentioned previously may be adopted as well.

[C] Other types, such as organic EL element chips, may also be adopted as long as the LED chips 24 are pair chips of the photo-semiconductor-type light emitting elements.

[D] The substrate 11 and the sealing frame 19 of Embodiment 1 are not limited to the square shape. For example, a rectangular shape, such as an oblong shape, may also be adopted.

[E] The bumps 25 may be substituted by solder, electro-conductive adhesive, anisotropic electro-conductive adhesive (anisotropic electro-conductive adhesive), etc.

[F] The LED chips 24 may also be connected with the wiring layer 15 by using wire bonding.

[G] The embodiments may be combined appropriately for embodiment.

In this case, the operations and advantages of the embodiments may be combined, or synergic effects can be realized.

The present invention is not limited to the embodiments. As long as the gist of the present invention is observed, various modifications may be adopted within the range that can be easily reached by the person skilled in the art. The contents of the papers, patent applications, published patents, etc. cited in the present embodiment are cited by incorporating the entire content thereof.

What is claimed is:

1. A light emitting device, comprising:
   a substrate;
   a wiring pattern comprising a wiring layer formed on the substrate;
   a plurality of light emitting elements connected to the wiring pattern;
   a sealing frame formed on the substrate to surround the plurality of light emitting elements;
   a transparent sealing member filled in an inside of the sealing frame to seal the light emitting elements;
   a light emitting portion formed in the sealing member;
   external electrodes made of the wiring layer formed on the outer side of the sealing frame on the substrate;
   a wall portion formed on the substrate and between the sealing frame and the external electrodes;
   a slit formed between the wall portion and the sealing frame; and
   a reflective layer, which is formed via an insulating layer on the wiring layer at the light emitting portion, and which covers almost the entire surface of the light emitting portion except the portions where the light emitting elements are arranged.

2. The light emitting device according to claim 1, wherein the wall portion includes the reflective layer.

3. The light emitting device according to claim 1, wherein the light emitting elements are connected to the wiring pattern by flip chip bonding.

4. The light emitting device according to claim 1, wherein at the light emitting portion, a gap corresponding to the wiring pattern is formed between the reflective layer and the insulating layer.

5. The light emitting device according to claim 1, wherein a triangular-shaped gap with a wider dimension on the outer edge side of the substrate is formed between the external electrodes for the wiring pattern.

6. The light emitting device according to claim 1, wherein the reflective layer is made of silver; and
   a protective film is formed on the reflective layer to protect the reflective layer.

7. The light emitting device according to claim 1, wherein the substrate has a rectangular shape, the sealing frame has a nearly rectangular frame shape, and, on the substrate, the sealing frame is arranged with an outer peripheral edge inclined with respect to an outer peripheral edge of the substrate.

8. The light emitting device according to claim 1, wherein the substrate has a rectangular shape, and the sealing frame has a round frame shape.

9. The light emitting device according to claim 1, wherein the plurality of light emitting elements is disposed on the wiring pattern.

10. The light emitting device according to claim 1, wherein a portion of the reflective layer is disposed between the sealing frame and the substrate.

11. The light emitting device according to claim 1, wherein, in a direction parallel with the substrate, the sealing frame is disposed between the light emitting elements and the wall portion.

12. The light emitting device according to claim 1, wherein, in a direction parallel with the substrate, the sealing frame and wall portion are disposed between the light emitting elements and the external electrodes.

13. The light emitting device according to claim 1, wherein the sealing frame and the wall portion are formed around a perimeter of the light emitting elements.

14. The light emitting device according to claim 1, wherein the slit extends to the wiring layer.

15. The light emitting device according to claim 1, wherein the wall portion comprises a lamination of an insulating layer, an other reflective layer and a protective layer.

16. The light emitting device according to claim 1, wherein a portion of the insulating layer, a portion of the reflective layer and a protective layer are disposed between the sealing frame and the wiring layer.

17. The light emitting device according to claim 1, wherein the light emitting elements are connected to the wiring pattern through holes in the reflective layer.

18. The light emitting device according to claim 1, wherein the light emitting elements are disposed within a perimeter of the sealing frame.

19. The light emitting device according to claim 1, wherein the sealing frame is arranged with an outer peripheral edge inclined with respect to an outer peripheral edge of the substrate.

* * * * *